United States Patent
Soh et al.

[19]

[11] Patent Number: 6,060,895
[45] Date of Patent: May 9, 2000

[54] WAFER LEVEL DIELECTRIC TEST STRUCTURE AND RELATED METHOD FOR ACCELERATED ENDURANCE TESTING

[75] Inventors: Sik-Han Soh, Sandy, Utah; Max C. Kuo, San Leandro, Calif.

[73] Assignee: Fairchild Semiconductor Corp., South Portland, Me.

[21] Appl. No.: 09/062,907

[22] Filed: Apr. 20, 1998

[51] Int. Cl.[7] ............................. G01N 27/14; G01R 31/26
[52] U.S. Cl. ............................. 324/760; 324/765; 438/18
[58] Field of Search .................................. 324/760, 763, 324/765, 719; 438/17, 18

[56] References Cited

U.S. PATENT DOCUMENTS

| | | | |
|---|---|---|---|
| 5,260,668 | 11/1993 | Mallory et al. | 324/719 |
| 5,285,418 | 2/1994 | Yamaguchi | 365/201 |
| 5,325,052 | 6/1994 | Yamashita | 324/760 |
| 5,406,212 | 4/1995 | Hashinaga et al. | 324/760 |
| 5,420,513 | 5/1995 | Kimura | 324/551 |
| 5,424,988 | 6/1995 | McClure et al. | 365/201 |
| 5,594,273 | 1/1997 | Dasse et al. | 257/620 |
| 5,619,462 | 4/1997 | McClure et al. | 365/201 |

*Primary Examiner*—Glenn W. Brown
*Attorney, Agent, or Firm*—Pierce Atwood; Chris A. Caseiro

[57] ABSTRACT

An accelerated endurance test structure and process that provides a wafer-level dielectric test. A wafer-level dielectric testing structure includes a heating element. The heating element may be poly-silicon or metal and is formed as a layer above a tunnel oxide layer of an integrated circuit (IC). A thermometer is provided to the heating element to regulate the temperature within the tunnel oxide area. The thermometer may be of a serpentine loop shape. Localized heating of the tunnel oxide structure occurs to a suitable temperature such as 250° Celsius where the endurance test is accelerated so as to assure failure in as little as 10 seconds. Accelerated endurance data on the structure is modeled based on the Arrhenius Equation to accurately predict endurance of the devices contained on the IC.

22 Claims, 3 Drawing Sheets

WAFER LEVEL DIELECTRIC TEST STRUCTURE AND RELATED METHOD FOR ACCELERATED ENDURANCE TESTING

BACKGROUND OF THE INVENTION

1. Field of the Invention

The present invention relates to the field of testing dielectrics. More particularly, the present invention relates to a device for testing a dielectric, e.g., a tunnel oxide, at the wafer level. The present invention also provides for a method of performing the testing using such a device. More particular yet, the present invention involves a localized heating element and local temperature sensor at the wafer level used to accelerate endurance testing of dielectric structures while providing accurate predictions of dielectric reliability and ultimate product endurance performance.

2. Description of the Prior Art

Production of integrated circuitry (IC) continues to increase throughout the world in response to the explosive growth of the electronics industry. Such IC's are commonly fabricated in multiple layers on a silicon wafer. The fabrication processes such as photo-lithographic etching or lost-wax methods typically involve many steps including depositing layers only microns thick of various metals, coating photo-resist, or otherwise etch-resistant, materials in circuitry patterns, etching away layer portions, bombarding such layer portions with ions, and repeating such steps in various manners to produce the IC of any given design. For example, an IC containing a metal-oxide-semiconductor (MOS) device has a thin layer of oxide over which a layer of conductive gate material, e.g., polysilicon, is formed and then defined. The MOS device source and drain are then formed, either by photo-lithography or by using the defined gates as a self-aligning mask. In some IC's, a capacitor may be formed by forming a layer of conductive material, e.g., polysilicon, over a thin layer of oxide. Normal back-end processing completes the fabrication of the IC.

Such fabrication is time-consuming and can take many hours, days, or even longer, depending on complexity, before a finished IC is ready for use within a subsequent electronic product. As the IC includes many microscopic elements that are sensitive to even the slightest impurities, IC fabrication occurs under strict clean-room conditions. Improper layering or etching or the introduction of impurities during fabrication results in weak oxide layers. For example, the silicon wafers may have been cleaned with wet chemicals, or contamination may have been present in the gate oxide tube used during fabrication. In any event, such defects may exist randomly anywhere within the IC structure, and will affect the reliability of every structure formed on the wafer that utilizes thin oxide layers, e.g., every MOS device and every capacitor. Additionally, damage may occur to the oxide upon its being subjected to an excessively charged environment. The oxide is especially vulnerable to charge-damage during fabrication steps such as plasma etching, plasma ashing, plasma deposition, ion implantation, and sputtering. Both contaminants and charge-damage can lead to oxide breakdown and ultimately to the failure of any product in which the IC containing the degraded oxide is utilized. As fabrication is performed on a mass-production scale, such IC failure can be extremely costly when it occurs at the product level. Accordingly, IC's typically undergo significant testing prior to their being used in an electronic product. Ideally, testing results should be ascertained as early in fabrication as possible so that corrections can be made without wasting time and materials.

Monitoring of the robustness of a dielectric film is normally done by stressing it to breakdown. A conventional stress method involves the application of a voltage to electrodes in which the dielectric film is sandwiched between. The parameter monitored could be the time dependent dielectric breakdown (TDDB) or the amount of charge that passed through the dielectric before breakdown (Charge-to-breakdown, $Q_{bd}$). The value of the TDDB or $Q_{bd}$ provide an indication of the quality of the film tested. By sampling the wafers during their processing, the fabrication process can be monitored for variations in dielectric quality. Accordingly, the fabrication process may be adjusted so as to maintain dielectric quality within tolerable limits. While this method of monitoring is widely used for predicting the ultimate threshold for dielectric breakdown, there are some problems with the method. The stress is normally performed at high electric field or current to induce failure within reasonable short time and it is widely known that it does not predict the endurance of nonvolatile memory such as EEPROM, EPROM, and FLASH. Endurance is the number of program-erase cycles it takes before breakdown of the dielectric occurs. In spite of its limited usefulness, $Q_{bd}$ and TDDB has typically been used to predict non-volatile memory endurance for the lack of better method.

An essential part of estimating operable life of a semiconductor device has been burn-in testing. Generally, burn-in tests are conducted using burn-in boards and a burn-in test chamber. IC's are placed within sockets in the burn-in boards and subsequently placed in the burn-in chamber. It is well known in the field of integrated circuit testing that burn-in testing of semiconductor components is a slow and expensive process, requiring very large test chambers. Simply put, burn-in testing involves the accelerated aging of an IC to determine to a reasonable certainty whether that IC will perform essentially as expected for its anticipated life. In practice, burn-in testing involves powering-up the IC, running test signals to the circuitry, and evaluating the IC response. This testing is conducted at elevated temperatures within the burn-in chamber for specified periods of time in a way that exposes "infant mortality failures" (those ICs that fail as a result of fabrication variations and that fail early in the test procedure, indicating much-earlier-than-expected failure if used under actual operating conditions). Thus from this TDDB method, $Q_{bd}$ is ascertained. Reaching $Q_{bd}$ early in the test procedure indicates a high infant mortality. Burn-in testing can also be used to expose "freak failures" (those IC's that do not apparently have fabrication flaws but that nevertheless fail at an unexpectedly early time in their service lives).

For the most part, present IC burn-in test procedures involve subjecting the IC's to test conditions after they are permanently connected with a number of other electronic devices as part of an entire module or package. As a result, failure of the particular IC under test means failure of the entire module or package and that entire package must be discarded. Needless to say, such IC failures are expensive. The recent expansion in the use of multichip packages with interconnected devices compounds the potential loss caused by the failure of a single chip under burn-in.

The device of Hashinaga et al. (U.S. Pat. No. 5,406,212) relates to burn-in testing. Apparently, the device is designed to reduce the burn-in time required. It includes an on-chip temperature sensor to sense junction temperature. The burn-in chamber's temperature is then controlled relative to the on-chip sensor. In that regard, the burn-in time may be optimized. However, the Hashinaga system does not provide localized heating that can be used to determine in a relatively short time whether particular semiconductor junctions of the circuitry under test are deficient. Instead, as with all burn-in testing, the Hashinaga system is die-rather than structure-responsive. It fails, therefore, to reduce in a substantial way the expense and time involved in circuit testing.

Accordingly, the prior art provides numerous ways to test complete semiconductor circuitry prior to insertion into packaging. However, that testing is time consuming and requires the expenditure of considerable energy to regulate the test temperature for the circuitry under test, whether that regulation involves heating, or, for bipolar devices, cooling. In no way does the prior art address the need to be able to effectively conduct localized testing, and, preferably, accelerated localized testing, particularly at the wafer level of the critical oxide structures that often define the quality of the circuitry. In that regard, it is necessary to ensure that any heat applied to localized structures is directed to such structures when and where required in order to minimize any effects on sub-circuitry that is not under analysis.

Therefore, what is needed is a wafer-level dielectric test apparatus and process that can be used to accurately evaluate oxide structure endurance that will closely match endurance of the actual product that include such structures, when that product is used as intended. What is also needed is a wafer-level dielectric test system with good predictability that minimizes test time through some form of acceleration. Further, what is needed is a wafer-level test system that provides reliable test-temperature management in order to ensure rapid and accurate heat input when required and where required.

SUMMARY OF THE INVENTION

It is therefore an object of the present invention to provide a wafer-level dielectric test system that can be used to perform simultaneous reliability tests on large numbers of dice on a particular wafer while also isolating individual dice on the wafer from each other, or discrete devices of a given die from each other. More particularly, it is an object of the present invention to provide a wafer-level dielectric test apparatus and process that can be used to accurately evaluate dielectric-structure endurance that will closely match endurance of the actual product that includes such structures. It is also an object to provide a wafer-level dielectric test system that provides reliable test-temperature management in order to ensure rapid and accurate heat input when required and where required, without the need for costly burn-in test chambers.

These and other objects are achieved in the present invention, which includes both a test structure and a testing method utilizing the test structure. The test structure is identical in all ways to a typical semiconductor device except for the addition of two parts. These additional parts allow the test structure to be used to predict the endurance of the actual product—i.e., the given semiconductor device which does not include the additional two parts but is identical in every other way to the test structure. The inventive test structure includes a semiconductor device (such as, but not limited to, a tunnel window array) and two primary components: a heater element and a thermostat element. These elements are both fabricated through the processes used in the IC fabrication as a whole—including, but not limited to, photolithography. One important feature of the test structure of the present invention is that fabrication of the test structure on the wafer-level produces a compact device. Moreover, the integration of the test structure along side the IC during the IC's fabrication process allows the inventive testing methods to be used immediately. In other words, testing of the test structure to gauge the quality of the ICs can occur during or immediately following its manufacture. As the heater and thermostat elements are integral with the semiconductor product, the inventive testing method does not require the use of costly and time-consuming burn-in test processes. Still further, the on-chip heating and temperature regulation achieved through use of the heating and thermostat elements provides localized heat to accelerate endurance testing in a manner that drastically reduces testing times.

By providing the localized heat at the wafer-level directly to the vicinity of the dielectric element to be tested (such as, but not limited to, a tunnel oxide), temperatures in the range of 250° Celsius or more can be used to produce breakdown in 10 seconds or less. The test method of the present invention further provides for using the test structure including the heating and thermostat elements in conjunction with the modeling of data based upon the well-known Arrhenius equation that defines, among other things, reaction rates as a function of temperature. In this particular case, such modeling is used to accurately predict dielectric breakdown failures at normal operating temperatures. As the test structure and actual semiconductor products—e.g., cell arrays—are virtually identical, accelerated endurance of the test structure closely matches the accelerated endurance of the actual product. Accordingly, the inventive method yields accurate prediction of actual semiconductor product endurance. The test structure is discussed in general below with reference to its two primary parts. Each dice need not be tested to predict the endurance of the IC because a representative sample of dice in any batch of ICs can be used as a test structure according to the present invention.

The heater element of the present invention is designed such that it provides localized heating of selected portions of the IC. As the heater element is formed during the IC fabrication, the heater element itself will be made from materials common to IC manufacture. Typically, the heater element will be fabricated from either polysilicon or metal and therefore includes some level of resistance that makes the heater element an effective resistive heating element. While heating by the heater element is discussed in terms of resistive heating, any suitable manner of heating consistent with semiconductor devices and well known to those skilled in this art may be used.

The temperature of the heater structure is controlled by regulating the current through it. The thermostat or thermometer element regulates the current through the heater structure via any known sensing feedback mechanism so as to achieve temperature regulation. A resistor with a known temperature coefficient of resistance (TCR) is preferably used as the thermometer element. The thermometer elements are chosen with consideration given to their TCRs such that these elements may maintain the temperature of the unit under test at a desired temperature given an available current and potential. In the preferred embodiment of the invention, a temperature of more than 250° Celsius may be achieved with an available current of 40 mA at 40 V. In general, the heater element will be polysilicon and the thermometer element will be metal. Further, the thermometer element is preferably formed in a serpentine shape so as to increase the available surface area under test to be regulated. However, any suitable materials and shape thereof may be used so long as they are capable of introducing the desired current and voltage resulting in the targeted temperatures.

In normal IC process flow, more than one level of polysilicon and metal are commonly used. Depending on the which of dielectric layer is of interest, either the substrate silicon, one of the polysilicon or metal layer could be used as the bottom electrode. The top electrode could be any one of the polysilicon or metal layer that are formed after the dielectric film has been grown/deposited. The heater and thermometer elements can be formed from any of the remaining polysilicon or metal layer. As an example, take a process flow with two polysilicon and two metal layers. If no floating gate is used in the semiconductor device of the IC, any one of the polysilicon layer can be formed as the heater element. The subsequent metal layer would then be used to form the thermometer element. Alternatively, for structures that include a floating gate, the first polysilicon layer will form the floating gate and the second polysilicon layer will form the control gate. The heating element and thermocouple element will be formed from any of the subsequent metal layers.

It is to be understood that other objects and advantages of the present invention will be made apparent by the following description of the drawings according to the present invention. While a preferred embodiment is disclosed, this is not intended to be limiting. Rather, the general principles set forth herein are considered to be merely illustrative of the scope of the present invention and it is to be further understood that numerous changes may be made without straying from the scope of the present invention.

DETAILED DESCRIPTION OF THE PREFERRED EMBODIMENTS

Figure 1:
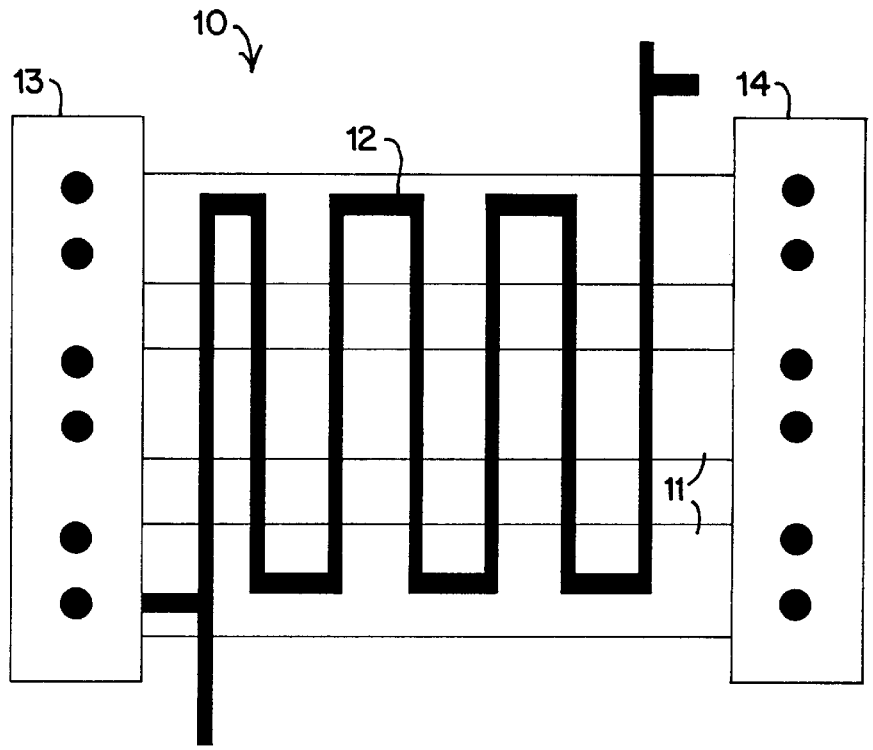
FIG. 1 is a top-view diagram of the test structure according to the present invention showing a heater element and a preferred thermometer element configuration.

In FIG. 1, an integral testing structure 10 of the present invention is shown having a heating element 11 and a thermostat or thermometer element 12. The preferred shape of the thermometer element 12 is a narrow, serpentine shape that can adequately assess temperature over oxide structures such as thin oxide capacitors or a tunnel window array (not shown). The thermometer element 12 is preferably fabricated of metal. The heating element 11 is formed as relatively wide strips from preferably either a polysilicon or metal material. The heating element 11 conducts a current between power rails 13 and 14. Such current is regulated by the thermometer element 12. The temperature regulation is achieve through monitoring the Voltage-Current characteristics of this thermometer element. Since the resistance and temperature coefficient of resistance (TCR) are known, the temperature around the element and temperature changes if any, can be monitored by looking at the Voltage-current characteristics. This information can be used as feedback to the heater element for controlling the temperature. The current flow through heating element 11 generates resistive heat. In order to create the test structure of the present invention, the testing structure 10 is formed upon a semiconductor product such as the one shown in FIGS. 2 and 2a.

Figure 2:
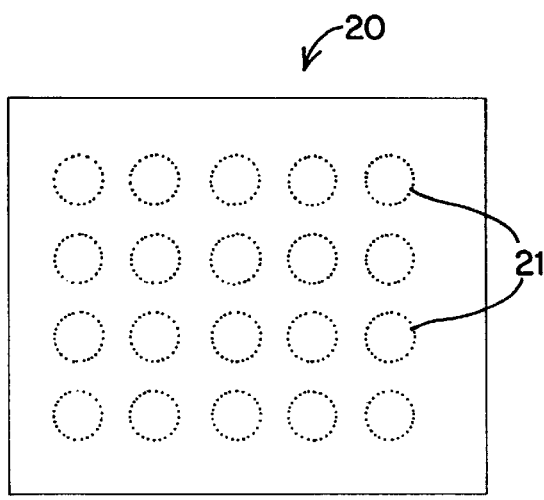
FIG. 2 is a top-view diagram of a known prior-art semiconductor structure showing some tunnel windows.
Figure 2A:
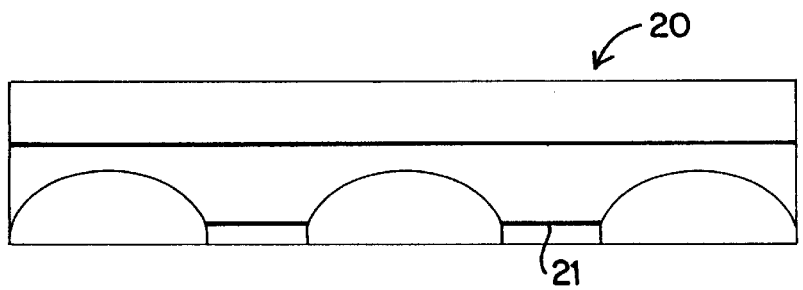
FIG. 2a is a cross-section of the prior-art semiconductor structure of FIG. 2 showing tunnel window detail.

FIG. 2 shows a top-view of a typical semiconductor product 20 that may be used in conjunction with the present invention. FIG. 2a is a cross-section of the semiconductor product 20 shown in FIG. 2. In these figures, the semiconductor product 20 is shown to include oxide structures in the form of an array of tunnel windows 21. Such a semiconductor product 20 is formed in any manner common to semiconductor fabrication methods. Preferably, such fabrication methods are also used to form the structure 10 during IC manufacture. It is anticipated that production-line disruption through the use of the present inventive test structure and test method will be minimized. This is because only a random sampling of any given semiconductor product would be provided with the additional layers constituting the structure 10. Further, the IC can be provided with the structure 10 at any suitable stage during the ICs manufacture. It should be noted that each dice need not be tested to predict the endurance of the IC. Thus, a representative sample of any batch of ICs can become a test structure according to the present invention through the additional formation of the structure 10 thereupon.

Figure 3:
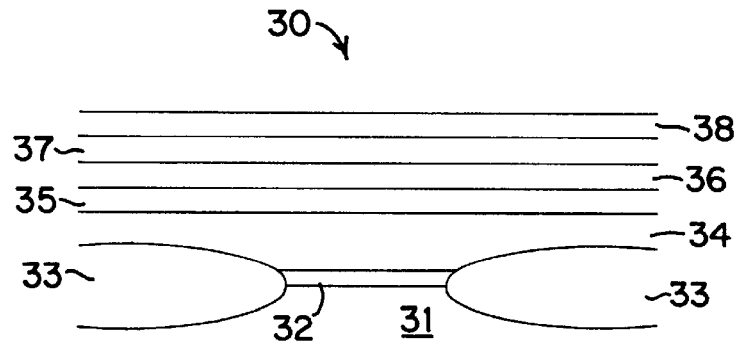
FIG. 3 is a cross-section of a first configuration of the present invention showing the test structure in combination with a first particular type of semiconductor device having only a floating gate.
Figure 4:
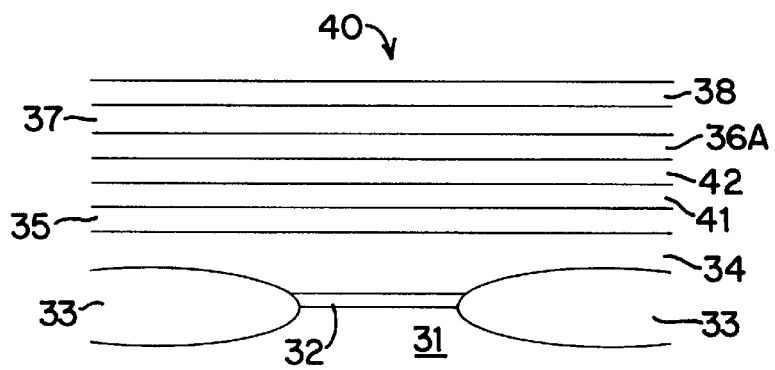
FIG. 4 is a cross-section of a second configuration of the present invention showing the test structure in combination with a second particular type of semiconductor device having a floating gate and a control gate.

FIGS. 3 and 4 illustrate how the present invention is used in conjunction with a first type of semiconductor device and second type of semiconductor device, respectively. According to the first embodiment of the present invention, the cross-section of FIG. 3 shows a complete test structure 30 without a control gate polysilicon. The test structure 30 includes an oxide structure formed on a silicon wafer 31. The oxide structure shown is a tunnel window that includes a tunnel oxide 32 situated within a thick oxide layer 33. For purposes of illustration, only one tunnel window is shown in cross-section. However, it should be understood that the tunnel oxide structure could be in the form of an area capacitor or multiple tunnel windows forming an array on the test structure 30. Such an array is discussed later with respect to FIGS. 5 and 5a.

With continued reference to FIG. 3, a floating gate polysilicon layer 34 is shown deposited over the tunnel oxide 32 and thick oxide layer 33. Further, an insulating layer 35 is deposited over the floating gate polysilicon layer 34. Up to this point, the aforementioned structures 31, 32, 33, 34, and 35 are typical of known semiconductor devices. The addition of a polysilicon (or metal) heating element 36 and subsequent metal thermometer element 38 with an intermediate insulative layer 37 therebetween is the point at which the typical semiconductor device becomes the test structure 30 according the instant invention. Each element 32 through 38 is fabricated by the same manufacturing processes to form an integral modified semiconductor product atop the silicon wafer 31. Such integral modified semiconductor device thus forms the instant invention.

A second illustration of the present invention is shown in the cross-section of FIG. 4. Test structure 40 is shown in FIG. 4 that is identical to the test structure 30 of FIG. 3 except for the additional polysilicon control gate 41 and related insulative layer 42 situated immediately beneath the polysilicon (or metal) heating element 36A. As the differences between FIGS. 3 and 4 illustrate, the underlying semiconductor product may be formed of varied and multiple layers. Specifically though, the present invention is concerned with semiconductor devices which require dielectric analysis in terms of oxide endurance.

Figure 5:
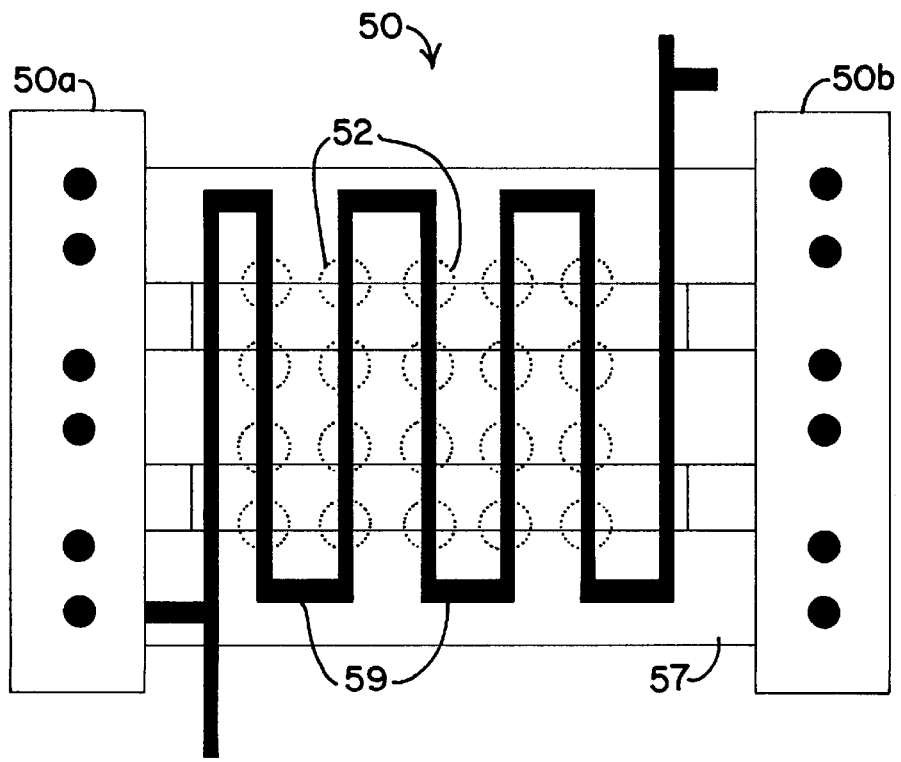
FIG. 5 is a top-view of the test structure as shown in FIG. 1 but in place on a tunnel oxide window array.
Figure 5A:
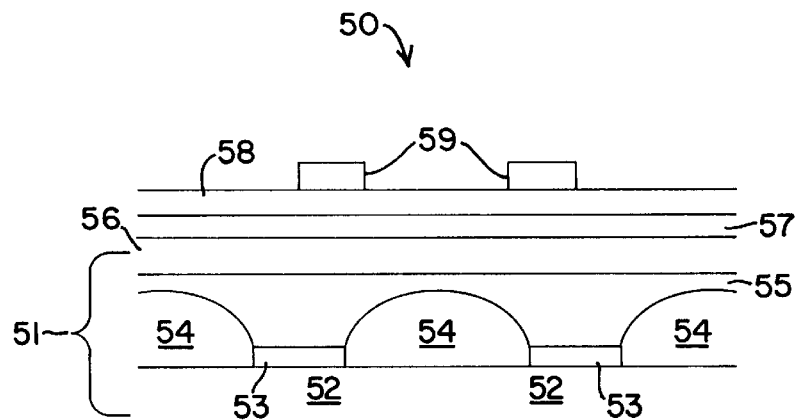
FIG. 5a is a cross-section of the test structure as shown in FIG. 5 showing the layers of the test structure of the present invention integral atop the tunnel oxide.

FIGS. 5 and 5a show the combination of the structure 10 of FIG. 1 and the typical tunnel window array 20 of FIG. 2 in a single integrated form according to the first embodiment of the present invention, i.e. without a floating gate. In FIG. 5a the test structure 50 includes an oxide structure 51. The oxide structure shown is an array of tunnel windows 52. Each tunnel window 52 includes a tunnel oxide 53 situated within a thick oxide layer 54. A floating gate polysilicon layer 55 is shown deposited over the tunnel oxide 53 and thick oxide layer 54. Further, an insulating layer 56 is deposited over the floating gate polysilicon layer 55. A polysilicon (or metal) heating element 57 between power rails 50a and 50b and a subsequent metal thermometer element 59 with an intermediate insulative layer 58 completes the test structure 30 in a manner similar to that shown in FIG. 1.

Figure 6:
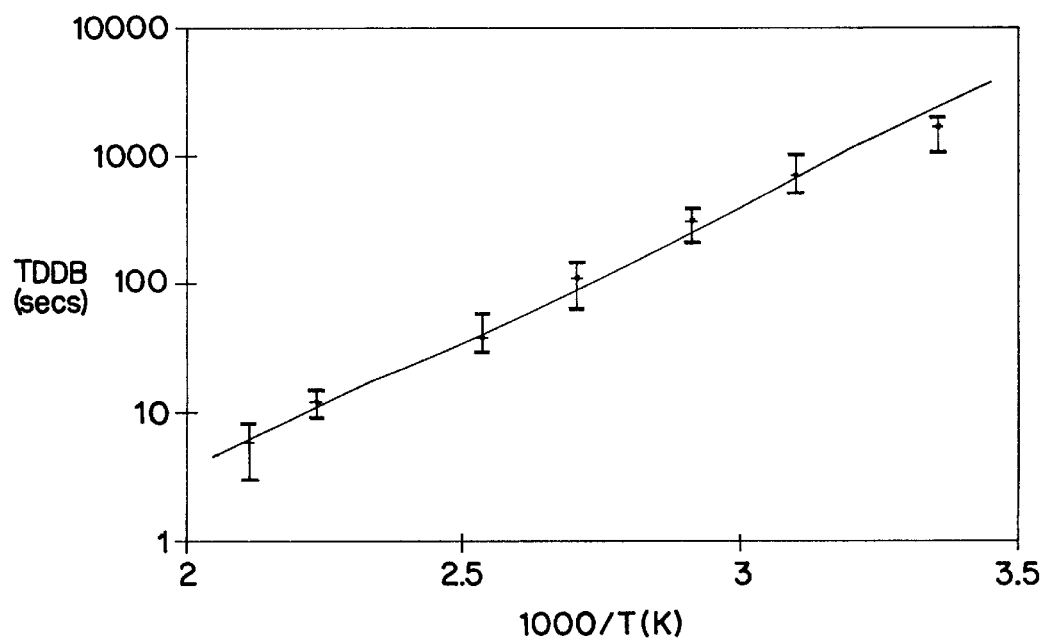
FIG. 6 is a plot of data generated through the test method according to the present invention derived from the test structure of the present invention as shown in FIG. 5.

The test method according to the present invention is an accelerated endurance test and involves using the test structure as a model to predict oxide endurance as if the heater and thermometer elements were not present. Through test research, data have been obtained which show that the oxide endurance of the underlying semiconductor product can be modeled by applying the Arrhenius Equation to the endurance test results from a limited number of the dice on a given wafer. This equation accurately predicts the effect of temperature on the rate constant for simple reactions. As a general rule, reaction rates double for each 10° Kelvin rise in temperature. For many reactions, it is found that the rate constant varies with temperature according to the Equation: $k = A \exp(-C/T)$, where k is the thermal activation energy, T is the test temperature in degrees Kelvin, and A and C are constants determined experimentally. The thermal activation energy can be extracted and used for projecting the expected endurance distribution of the dice on the wafer in which the accelerated test has been done. FIG. 6 is a graphical representation of this relationship. The plot in FIG. 6 shows a constant slope for endurance versus 1000/T. This reveals that prediction of endurance at normal operation can be accurately done with temperature acceleration. More specifically, the test from which FIG. 6 is derived involved an input of a square wave pulse of ±13 volts peak at 200 Hertz. The data was collected by producing breakdown at varied temperatures. The vertical axis is plotted in terms of time to breakdown (TDDB in seconds) to show the time it would take to complete the test. From the plot, it is readily apparent that at 250 degrees Celsius, the time for the test can be reduced to less than 10 seconds. Further, by extending the plot towards the origin, one can easily predict the time to breakdown (TDDB) at normal operating temperatures. This method has been found to be an accurate predictor of endurance for the semiconductor product without a heater and thermometer element. That is, under conditions of accelerated aging by placing a component under test in a high-temperature environment rather than using the type of localized heating associated with the present invention.

It should be understood that the preferred embodiments mentioned here are merely illustrative of the present invention. Numerous variations and equivalents in design and use of the present invention may be contemplated in view of the following claims without straying from the intended scope and field of the invention herein disclosed.

We claim:

1. A wafer-level test structure for testing dielectric endurance of a semiconductor device, the test structure comprising:
   a) a heating element applied to the semiconductor device for heating an area including one or more oxide structures of the semiconductor device; and
   b) a thermometer element applied to the semiconductor device for regulating a temperature of said heating element,
   wherein said heating element and said thermometer element enable accelerated dielectric endurance testing of the semiconductor device by regulated heating of localized areas including the one or more oxide structures of the semiconductor device to yield a prediction of actual endurance of the semiconductor device.

2. The test structure as claimed in claim 1, wherein said heating element is formed in a specified shape designed to cause resistive heating throughout said heating element during application of a current to said heating element.

3. The test structure as claimed in claim 2, wherein said heating element is a layer of material deposited upon the semiconductor device near the one or more oxide structures to be tested.

4. The test structure as claimed in claim 3, wherein said thermometer element is a sensing element usable in a temperature sensing feedback mechanism that regulates said current applied to said heating element.

5. The test structure as claimed in claim 4, wherein said sensing element is a resistor having a predetermined temperature coefficient of resistance.

6. The test structure as claimed in claim 5, wherein a shape of said thermometer element is substantially serpentine.

7. The test structure as claimed in claim 6, wherein said thermometer element is a layer of metal deposited upon said heating element.

8. The test structure as claimed in claim 7, wherein said heating element is a layer of polysilicon deposited upon the semiconductor device.

9. The test structure as claimed in claim 7, wherein said heating element is a layer of metal deposited upon the semiconductor device.

10. A wafer-level test structure for testing dielectric endurance of a semiconductor device, the test structure comprising:
    a) a heating element for supplying resistive heating to an area surrounding one or more oxide structures of the semiconductor device; and
    b) a thermometer element including a resistor having a predetermined temperature coefficient of resistance,
    wherein said heating element and said thermometer are fabricated as integral layers upon the semiconductor device, and wherein said heating element and said thermometer element enable accelerated dielectric endurance testing of the semiconductor device by regulated heating of localized areas including the one or more oxide structures of the semiconductor device to yield a prediction of actual endurance of the semiconductor device.

11. The test structure as claimed in claim 10, wherein said thermometer element is a substantially serpentine-shaped layer of material and said heating element is deposited upon the semiconductor device near the one or more oxide structures.

12. The test structure as claimed in claim 10, wherein said thermometer element is a layer of metal deposited upon said heating element.

13. The test structure as claimed in claim 12, wherein said heating element is a layer of polysilicon deposited upon the semiconductor device.

14. The test structure as claimed in claim 12, wherein said heating element is a layer of metal deposited upon the semiconductor device.

15. A wafer-level test method for testing dielectric endurance of a semiconductor product utilizing a test structure having heating features, said method comprising the steps of:

a) forming a semiconductor product having one or more oxide structures;

b) depositing a first layer of material upon said semiconductor product to form a heating element;

c) depositing a second layer of material upon said first layer of material to form a thermometer element;

d) applying an operating voltage to said semiconductor product;

e) applying a current through said heating element;

f) regulating said current by way of said thermometer element;

g) sensing an elevated temperature of said one or more oxide structures;

h) obtaining a data set of breakdown times for operation of said semiconductor device in a range of temperatures;

i) plotting said data set according to the Arrhenius equation on a graph of time versus temperature; and j) extrapolating a non-accelerated breakdown time at normal operating temperature from said graph.

16. The test method as claimed in claim 15, wherein said heating element is formed in a specified shape designed to cause resistive heating throughout said heating element during application of a current to said heating element.

17. The test method as claimed in claim 16, wherein said heating element is a layer of conductive material deposited upon the semiconductor product near the one or more oxide structures.

18. The test method as claimed in claim 17, wherein said thermometer element is a sensor element for maintaining the one or more oxide structures at a temperature of more than 250 degrees Celsius.

19. The test method as claimed in claim 18, wherein a shape of said thermometer element is substantially serpentine.

20. The test method as claimed in claim 19, wherein said thermometer element is a layer of metal.

21. The test method as claimed in claim 20, wherein said heating element is a layer of polysilicon.

22. The test method as claimed in claim 20, wherein said heating element is a layer of metal.

* * * * *